(12) United States Patent
Lee

(10) Patent No.: US 11,851,115 B2
(45) Date of Patent: Dec. 26, 2023

(54) METHOD FOR DETECTING ERROR IN REFERENCE SIGNAL OF ANALOG-TO-DIGITAL CONVERTER IN MOTOR DRIVEN POWER STEERING SYSTEM AND ELECTRONIC DEVICE THEREOF

(71) Applicant: HYUNDAI MOBIS CO., LTD., Seoul (KR)

(72) Inventor: Tae Hee Lee, Seoul (KR)

(73) Assignee: Hyundai Mobis Co., Ltd., Seoul (KR)

( * ) Notice: Subject to any disclaimer, the term of this patent is extended or adjusted under 35 U.S.C. 154(b) by 113 days.

(21) Appl. No.: 17/367,782

(22) Filed: Jul. 6, 2021

(65) Prior Publication Data
US 2022/0009545 A1    Jan. 13, 2022

(30) Foreign Application Priority Data
Jul. 13, 2020    (KR) .................. 10-2020-0086018

(51) Int. Cl.
*B62D 5/04* (2006.01)
*H03M 1/06* (2006.01)

(52) U.S. Cl.
CPC ........... *B62D 5/0406* (2013.01); *B62D 5/046* (2013.01); *H03M 1/0604* (2013.01)

(58) Field of Classification Search
CPC ........ B62D 5/0463; B62D 5/046; B62D 5/04; B62D 5/049; B62D 5/0487; B62D 5/0484; B62D 5/0481; H02P 27/08; H02P 21/06; H02P 6/08; H02P 6/16; H02P 27/06; H02P 23/03; H02P 6/10; H02P 6/00
See application file for complete search history.

(56) References Cited

U.S. PATENT DOCUMENTS 9,600,005 B2    3/2017  Hayashi et al.
2015/0205314 A1*    7/2015  Hayashi ................... G05F 1/56
                                                                 323/217

FOREIGN PATENT DOCUMENTS

CN          104793677 A    7/2015
KR    10-2020-0046792 A    5/2020

OTHER PUBLICATIONS

Chinese Office Action dated Apr. 29, 2023, in counterpart Chinese Patent Application No. 202110774414.X (7 pages in Chinese).

* cited by examiner

*Primary Examiner* — Said Bouziane
(74) *Attorney, Agent, or Firm* — NSIP Law

(57) ABSTRACT

An electronic device may include: a power management integrated circuit (PMIC); and a micro controller unit (MCU) electrically connected to the PMIC. The MCU may be configured to: generate, based on a first driving power signal output from the PMIC to drive the MCU, a digital signal for determining an error in a reference signal of an analog-to-digital converter (ADC) included in the MCU; identify an error rate of the digital signal; and determine a mode for controlling a motor driven power steering system, based on the error rate of the digital signal.

19 Claims, 3 Drawing Sheets

METHOD FOR DETECTING ERROR IN REFERENCE SIGNAL OF ANALOG-TO-DIGITAL CONVERTER IN MOTOR DRIVEN POWER STEERING SYSTEM AND ELECTRONIC DEVICE THEREOF

CROSS-REFERENCE TO RELATED APPLICATIONS

This application claims the benefit under 35 U.S.C. § 119(a) of Korean Patent Application No. 10-2020-0086018 filed on Jul. 13, 2020 in the Korean Intellectual Property Office, the entire disclosure of which is incorporated herein by reference for all purposes.

BACKGROUND

Field

Exemplary embodiments of the present disclosure relate to a method for detecting an error in a reference signal of an analog-to-digital converter in a motor driven power steering system and an electronic device thereof.

Discussion of the Background

Recently, vehicles have various functions for improving the convenience of a driver, and are provided with various advanced detection sensors and electronic control devices in order to implement such functions. For example, a motor driven power steering system that helps a driver to easily operate a steering wheel is being provided to a vehicle. Such a motor driven power steering system may perform a function of assisting a driver's steering by using a motor.

The background art of the present disclosure is disclosed in Korean Patent Application Laid-Open No. 10-2020-0046792 (published on May 7, 2020 and entitled "A Control Method of MDPS").

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device includes: a power management integrated circuit (PMIC); and a micro controller unit (MCU) electrically connected to the PMIC. The MCU is configured to: generate, based on a first driving power signal output from the PMIC to drive the MCU, a digital signal for determining an error in a reference signal of an analog-to-digital converter (ADC) included in the MCU; identify an error rate of the digital signal; and determine a mode for controlling a motor driven power steering system, based on the error rate of the digital signal.

The MCU may be further configured to enter a power steering system safe mode limiting at least some functions of the motor driven power steering system, in response to the error rate of the digital signal exceeding a reference error rate.

The ADC may be configured to drive an internal sensor for the motor driven power steering system by using, as a reference signal, a second driving power signal outputted from the power management integrated circuit in order.

The electronic device may further include: a plurality of resistors configured to adjust a voltage of the first driving power signal to generate a voltage-adjusted first driving power signal. The ADC may be further configured to convert the voltage-adjusted first driving power signal into the digital signal based on the reference signal, in response to receiving the voltage-adjusted first driving power signal, as at least a part of an operation for generating the digital signal.

The reference error rate may be determined as a value obtained by summing any one or any combination of any two or more of an error rate of an MCU power supply low dropout (LDO) that transmits the first driving power signal to the MCU, an error rate of the plurality of resistors, and an error rate of the ADC.

The MCU may be further configured to identify the error rate of the digital signal by comparing the digital signal with a previously stored digital signal, as at least a part of an operation for identifying the error rate of the digital signal.

The power steering system safe mode may include any one or any combination of any two or more of a manual mode of a general motor driven power steering system, an output limit mode of a full redundancy motor driven power steering system, and a manual mode of the full redundancy motor driven power steering system.

In another general aspect, a method to operate an electronic device includes: generating, by a micro controller unit (MCU) of the electronic device, based on a first driving power signal output from a power management integrated circuit (PMIC) of the electronic device to drive the MCU, a digital signal for determining an error in a reference signal of an analog-to-digital converter (ADC) included in the MCU; identifying, by the MCU, an error rate of the digital signal; and determining a mode for controlling a motor driven power steering system, based on the error rate of the digital signal.

The method may further include causing the MCU to enter a power steering system safe mode limiting at least some functions of the motor driven power steering system, in response to the error rate of the digital signal exceeding a reference error rate.

The method may further include driving, by the ADC, an internal sensor for the motor driven power steering system, using a second driving power signal output from the PMIC as a reference signal.

The generating of the digital signal may include: in response to reception of the first driving power signal having a voltage adjusted through a plurality of resistors, converting, by the ADC, the voltage-adjusted first driving power signal into the digital signal, based on the reference signal.

The reference error rate is determined as a value obtained by summing any one or any combination of any two or more of an error rate of an MCU power supply low dropout (LDO) that transmits the first driving power signal to the MCU, an error rate of the plurality of resistors, and an error rate of the ADC.

The identifying of the error rate of the digital signal may include: identifying, by the MCU, the error rate of the digital signal by comparing the digital signal with a previously stored digital signal.

The power steering system safe mode may include any one or any combination of any two or more of a manual mode of a general motor driven power steering system, an output limit mode of a full redundancy motor driven power steering system, and a manual mode of the full redundancy motor driven power steering system.

Other features and aspects will be apparent from the following detailed description, the drawings, and the claims.

DETAILED DESCRIPTION OF THE ILLUSTRATED EMBODIMENTS

Figure 1:
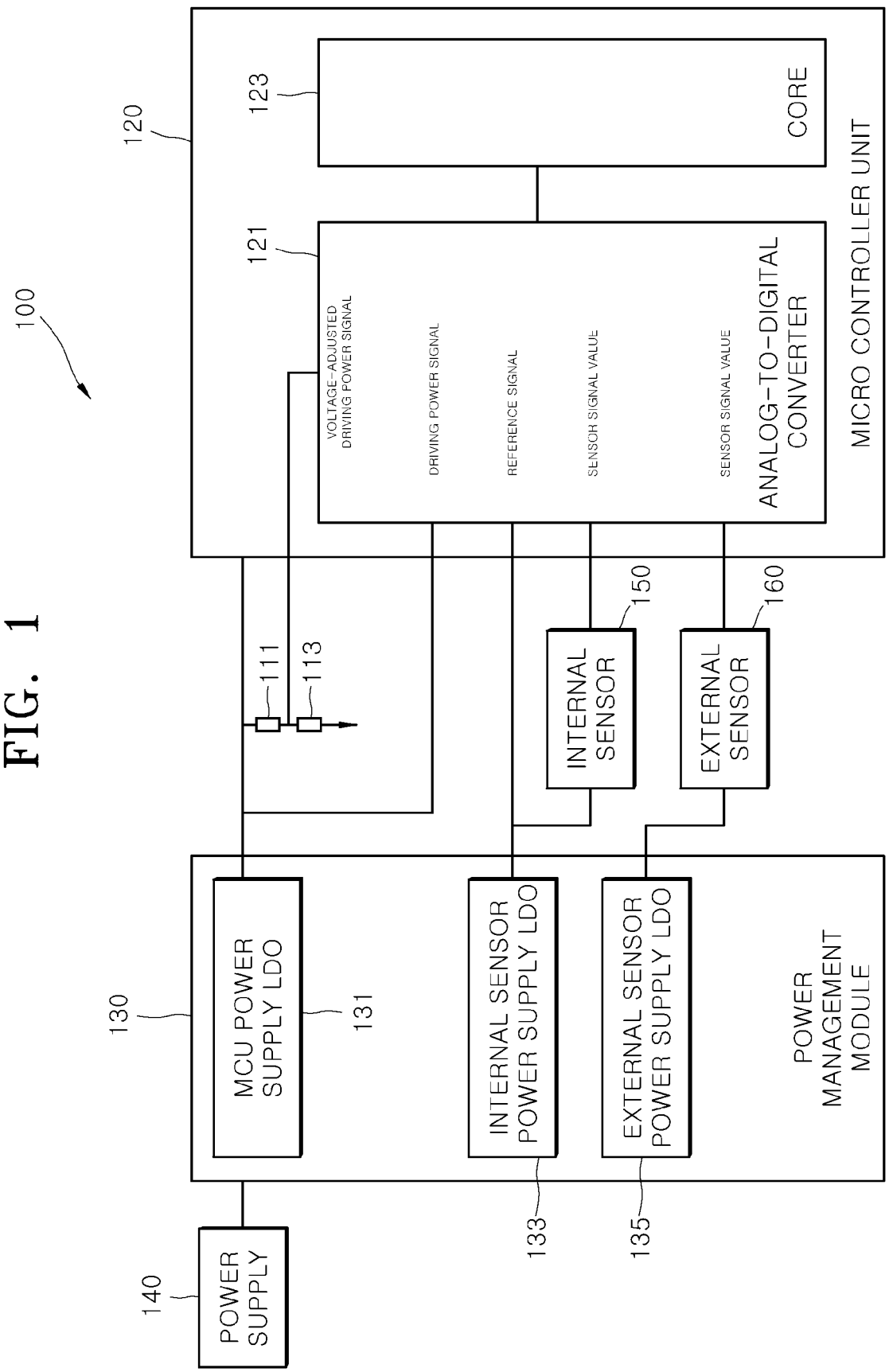
FIG. 1 is a block diagram of an electronic device in accordance with various embodiments.

As is traditional in the corresponding field, some exemplary embodiments may be illustrated in the drawings in terms of functional blocks, units, and/or modules. Those of ordinary skill in the art will appreciate that these block, units, and/or modules are physically implemented by electronic (or optical) circuits such as logic circuits, discrete components, processors, hard-wired circuits, memory elements, wiring connections, and the like. When the blocks, units, and/or modules are implemented by processors or similar hardware, they may be programmed and controlled using software (e.g., code) to perform various functions discussed herein. Alternatively, each block, unit, and/or module may be implemented by dedicated hardware or as a combination of dedicated hardware to perform some functions and a processor (e.g., one or more programmed processors and associated circuitry) to perform other functions. Each block, unit, and/or module of some exemplary embodiments may be physically separated into two or more interacting and discrete blocks, units, and/or modules without departing from the scope of the inventive concept. Further, blocks, units, and/or module of some exemplary embodiments may be physically combined into more complex blocks, units, and/or modules without departing from the scope of the inventive concept.

Hereinafter, various embodiments of the present document will be described below with reference to the accompanying drawings. Embodiments and terms used therein are not intended to limit the technology described in the present document to specific embodiments, and should be construed to include various modifications, equivalents, and/or alternatives of corresponding embodiments. In relation to the description of the drawings, similar reference numerals may be used for similar components. An expression in a singular form may include expression in a plural form unless the context clearly indicates otherwise. In the present document, expressions such as "A or B" or "at least one of A and/or B" may include all possible combinations of items listed together. Expressions such as "first" or "second" may modify corresponding components regardless of order or importance, are used only to distinguish one component from another component, and do not limit corresponding components. When a (for example: first) component is referred to as being "(functionally or communicatively) connected" or "coupled" to another a (for example: second) component, the component may be directly connected to the another component or may be connected to the another component through still another component (for example: third component).

In the present document, "configured to (or set)" may be interchangeably used with "suitable for", "having the ability to", "modified to", "made to", "capable of", or "designed to" depending on the situation, for example, in a hardware or software manner. In some circumstances, an expression "device configured to" may mean that the device is "capable of" with other devices or parts. For example, a "processor configured to (or set) perform A, B, and C" may mean a dedicated processor (for example, an embedded processor) for performing a corresponding operation, or a general-purpose processor (for example, a CPU or an application processor) capable of performing a corresponding operation by executing one or more software programs stored in a memory device.

Figure 2:
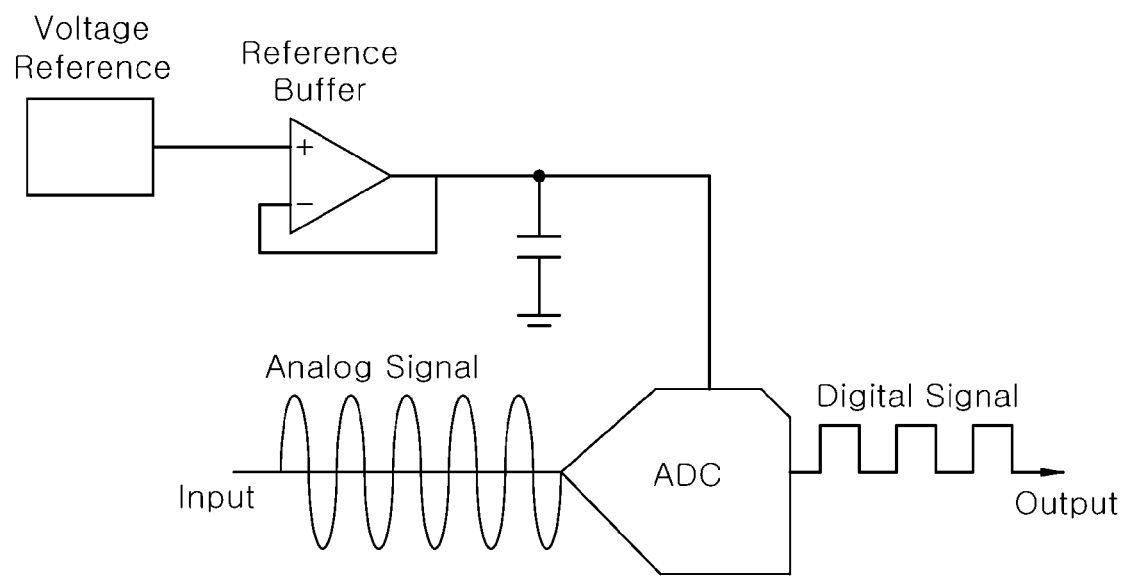
FIG. 2 is a diagram illustrating an analog-to-digital converter in accordance with various embodiments.

FIG. 1 is a block diagram of an electronic device in accordance with various embodiments. FIG. 2 is a diagram illustrating an analog-to-digital converter in accordance with various embodiments.

Referring to FIG. 1 and FIG. 2, an electronic device 100 may include a micro controller unit (MCU) 120, a power management module 130, a power supply 140, an internal sensor 150, and an external sensor 160. In accordance with an embodiment, components of the electronic device 100 are not limited to the aforementioned components, and may also further include other components in addition to the aforementioned components. In accordance with an embodiment, the micro controller unit 120 may include an analog-to-digital converter (ADC) 121 and a core 123. In accordance with an embodiment, the power management module 130 may include a micro controller unit (MCU) power supply low dropout (LDO) 131, an internal sensor power supply low dropout (LDO) 133, and an external sensor power supply low dropout (LDO) 135.

In accordance with various embodiments, the micro controller unit 120 may operate on the basis of a driving power signal supplied from the MCU power supply LDO 131. For example, the analog-to-digital converter 121 and the core 123 of the micro controller unit 120 may operate on the basis of driving power supplied from the MCU power supply LDO 131. In accordance with an embodiment, the micro controller unit 120 may determine whether there is an error in the driving power signal, which is supplied from the MCU power supply LDO 131, by identifying the voltage level of the driving power signal.

In accordance with various embodiments, the micro controller unit 120 may convert an analog signal received from the internal sensor 150 (for example, a current sensor, a temperature sensor, and the like) and/or the external sensor 160 (for example, a torque sensor, a steering angle sensor, and the like) into a digital signal by using the analog-to-digital converter 121. Specifically, when the analog signal is received from the internal sensor 150 or the external sensor 160, the analog-to-digital converter 121 of the micro controller unit 120 may convert the analog signal into the digital signal on the basis of a reference signal supplied from the internal sensor power supply LDO 133 of the power management module 130, and provide the digital signal to the core 123 of the micro controller unit 120. The core 123 may control a power steering system of a vehicle on the basis of the digital signal outputted through the analog-to-digital converter 121. In accordance with an embodiment, the analog-to-digital converter 121 may be implemented as illustrated in FIG. 2, and in such a case, the reference signal supplied from the internal sensor power supply LDO 133 is supplied as a voltage reference, the analog signal supplied from the internal sensor 150 or the external sensor 160 is supplied as the input of the ADC, and the digital signal may be defined by <Equation 1> below.

$$\text{Digital Output} = (2^N \times \text{Analog Input Voltage}) / \text{Reference Voltage} \qquad \text{<Equation 1>}$$

In <Equation 1> above, Digital Output may denote the converted digital signal, Analog Input Voltage may denote the analog signal supplied from the sensor, and Reference Voltage may denote the reference signal of the analog-to-digital converter. The circuit configuration of FIG. 2 is only one embodiment, and the circuit configuration of the analog-to-digital converter may be implemented in a manner different from that of FIG. 2.

In accordance with various embodiments, the micro controller unit 120 may determine whether there is an error in the reference signal of the analog-to-digital converter 121 on the basis of the driving power signal supplied from the MCU power supply LDO 131. Specifically, after a voltage of the driving power signal outputted from the MCU power supply LDO 131 is adjusted through a plurality of resistors 111 and 113, the voltage-adjusted driving power signal may be supplied to the analog-to-digital converter 121 of the micro controller unit 120, and the analog-to-digital converter 121 of the micro controller unit 120 may convert the voltage-adjusted driving power signal into a digital signal on the basis of the reference signal supplied from the internal sensor power supply LDO 133, and transmit the converted digital signal to the core 123 of the micro controller unit 120. When the digital signal converted from the voltage-adjusted driving power signal is received, the core 123 may identify an error rate of the digital signal and determine whether there is an error in the reference signal on the basis of the identified error rate. Since the driving power signal supplied from the MCU power supply LDO 131 has a constant value (for example, 3.3 V), the digital signal generated on the basis of the driving power signal may have a constant value. Accordingly, in the present disclosure, by determining whether the error rate of the digital signal generated on the basis of the driving power signal exceeds a reference error rate (for example, typically within 3% to 4%), it is possible to determine whether there is an error in the reference signal. For example, when the digital signal generated on the basis of the driving power signal is provided, the core 123 may identify the error rate of the provided digital signal by comparing the provided digital signal with a previously stored digital signal, and determine that there is an error in the reference signal when the identified error rate exceeds the reference error rate. In accordance with an embodiment, the reference error rate may be determined on the basis of an error that may occur according to product implementation. For example, the reference error rate may be determined as a value obtained by summing up at least some of an error rate of the MCU power supply LDO 131, an error rate of the plurality of resistors 111 and 113, and an error rate of the analog-to-digital converter 121.

In accordance with various embodiments, when an error in the reference signal is detected, the micro controller unit 120 may enter a power steering system safe mode. When there is the error in the reference signal, the steering of a vehicle may be controlled differently from the intention of a driver of the vehicle, resulting in a vehicle accident. Accordingly, in response to the detection of the error in the reference signal, the micro controller unit 120 may enter the power steering system safe mode such that at least some functions of a motor driven power steering system are limited. In accordance with an embodiment, the power steering system safe mode may include a manual mode of a general motor driven power steering system, an output limit mode or a manual mode of a full redundancy motor driven power steering system, and the like. In accordance with an embodiment, when no error in the reference signal is detected, the micro controller unit 120 may perform a normal power steering system assist.

In accordance with various embodiments, the power management module 130 may supply power to another component (for example, the micro controller unit 120) on the basis of power supplied from the power supply 140. In accordance with an embodiment, the MCU power supply LDO 131 may provide the micro controller unit 120 with a driving power signal (for example, 3.3 V) for driving the micro controller unit 120. In accordance with an embodiment, in order to detect an error in the reference signal, the voltage of the driving power signal outputted from the MCU power supply LDO 131 may be adjusted on the basis of the plurality of resistors 111 and 113, and then the voltage-adjusted driving power signal may be supplied to the micro controller unit 120. In accordance with an embodiment, the internal sensor power supply LDO 133 may supply the internal sensor 150 with a driving power signal (for example, 5 V) for driving the internal sensor 150 for the motor driven power steering system, and supply a reference signal (for example, 5 V) to the analog-to-digital converter 121. In accordance with an embodiment, the external sensor power supply LDO 135 may supply the external sensor 160 with a driving power signal (for example, 5 V) for driving the external sensor 160 for the motor driven power steering system. In accordance with an embodiment, the power management module 130 may be referred to as a power management integrated circuit (PMIC).

In the above, it has been described that the voltage of the driving power signal outputted from the MCU power supply LDO 131 is adjusted through the plurality of resistors 111 and 113 and then the voltage-adjusted driving power signal is supplied to the analog-to-digital converter 121. However, in accordance with various embodiments, the driving power signal may also be supplied to the analog-to-digital converter 121 without voltage adjustment. In such a case, the analog-to-digital converter 121 may convert the driving power signal into a digital signal, and determine whether there is an error in the reference signal by using the converted digital signal.

As described above, the electronic device 100 detects an error in the reference signal of the analog-to-digital converter 121 and limits some functions of the power steering system in response to the detection of the error, thereby substantially preventing the occurrence of vehicle accidents caused by an erroneous operation of the power steering system due to the error in the reference signal. Furthermore, the electronic device 100 proposed in the present disclosure utilizes the configuration of a motor driven power steering system in the related art and adds only some components (for example, the resistors 111 and 113), thereby minimizing additional costs due to technology application.

Figure 3:
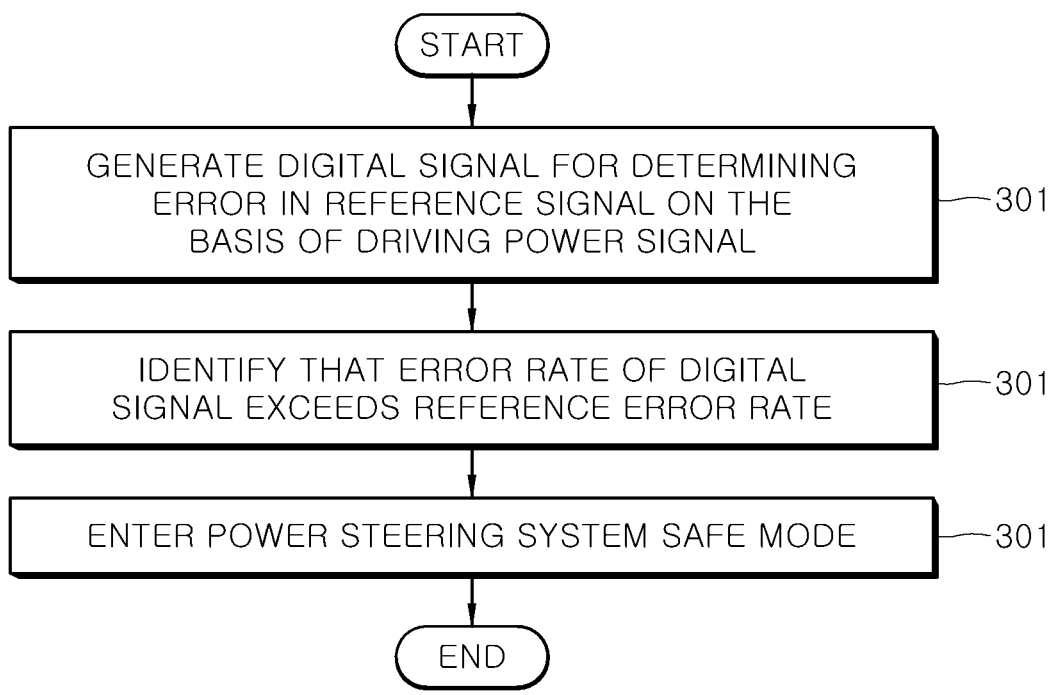
FIG. 3 is a flowchart for explaining a method in which the electronic device in accordance with various embodiments detects an error in a reference signal of the analog-to-digital converter.

FIG. 3 is a flowchart for explaining a method in which the electronic device in accordance with various embodiments detects an error in the reference signal of the analog-to-digital converter.

Referring to FIG. 3, in an operation 301, a micro controller unit (for example, the micro controller unit 120 of FIG. 1) of an electronic device (for example, the electronic device 100 of FIG. 1) may generate a digital signal for determining an error in a reference signal of an analog-to-digital converter (for example, the analog-to-digital converter 121 of FIG. 1) on the basis of a driving power signal supplied from a MCU power supply LDO (for example, the MCU power supply LDO 131 of FIG. 1). For example, the voltage of the driving power signal outputted from the MCU power supply LDO 131 is adjusted by the plurality of resistors 111 and 113 and the voltage-adjusted driving power signal is provided to the analog-to-digital converter 121. When the voltage-adjusted driving power signal is received, the analog-to-digital converter 121 may convert the voltage-adjusted driving power signal into a digital signal by using a reference signal supplied from the internal sensor power supply LDO 133. The digital signal converted through the analog-to-digital converter 121 may be provided to the core 123 of the micro controller unit 120.

In an operation 303, the micro controller unit 120 may identify that the error rate of the digital signal exceeds the reference error rate. For example, the core 123 of the micro controller unit 120 may identify the error rate of the digital signal by comparing the digital signal provided from the analog-to-digital converter 121 with a previously stored digital signal, and determine whether the identified error rate exceeds the reference error rate, thereby identifying that the error rate of the digital signal exceeds the reference error rate. In accordance with an embodiment, the reference error rate may be determined as a value obtained by summing up at least some of an error rate of the MCU power supply LDO 131, an error rate of the plurality of resistors 111 and 113, and an error rate of the analog-to-digital converter 121. In accordance with an embodiment, when the error rate of the digital signal does not exceed the reference error rate, the core 123 may perform an assist function of the motor driven power steering system on the basis of the digital signal.

In an operation 305, in response to the identification of the error rate of the digital signal which exceeds the reference error rate, the micro controller unit 120 may enter the power steering system safe mode. For example, when it is identified that the error rate of the digital signal exceeds the reference error rate, the micro controller unit 120 may determine that there is an error in the reference signal of the analog-to-digital converter 121, and enter the power steering system safe mode such that at least some functions of the motor driven power steering system are limited. In accordance with an embodiment, the power steering system safe mode may include a manual mode of a general motor driven power steering system, an output limit mode or a manual mode of a full redundancy motor driven power steering system, and the like.

As described above, the electronic device 100 detects an error in the reference signal of the analog-to-digital converter 121 and limits some functions of the power steering system in response to the detection of the error, thereby substantially preventing the occurrence of vehicle accidents caused by an erroneous operation of the power steering system due to the error in the reference signal. Furthermore, the electronic device 100 proposed in the present disclosure utilizes the configuration of a motor driven power steering system in the related art and adds only some components (for example, the resistors 111 and 113), thereby minimizing additional costs due to technology application.

The term "module" used in the present document may include a unit implemented in hardware, software, or firmware, and for example, may be used interchangeably with terms such as logic, logic block, parts, or circuit. The module may be integrally formed parts, or a minimum unit or a part of the parts that perform one or more functions. For example, In accordance with an embodiment, the module may be implemented in the form of an application-specific integrated circuit (ASIC).

In accordance with various embodiments, each component (for example, a module or a program) among the aforementioned components may include a singular entity or a plurality of entities. In accordance with various embodiments, among the aforementioned components, one or more components or operations may be omitted or added. Alternatively or additionally, a plurality of components (for example, modules or programs) may be integrated into one component. In such a case, the integrated component may perform one or more functions of each component among the plurality of components identically or similarly to those performed by a corresponding component among the plurality of components before the integration. In accordance with various embodiments, operations performed by the module, the program, or other components may be performed sequentially, in parallel, repetitively, or heuristically, one or more of the operations may be performed in a different order or omitted, or one or more other operations may be added.

What is claimed is:

1. An electronic device, comprising:
   a power management integrated circuit (PMIC);
   a plurality of resistors configured to adjust a voltage of a first driving power signal to generate a voltage-adjusted first driving power signal; and
   a micro controller unit (MCU) electrically connected to the PMIC,
   wherein the MCU is configured to:
      generate, based on the first driving power signal output from the PMIC to drive the MCU, a digital signal for determining an error in a reference signal of an analog-to-digital converter (ADC) included in the MCU;
      identify an error rate of the digital signal; and
      determine a mode for controlling a motor driven power steering system, based on the error rate of the digital signal.

2. The electronic device according to claim 1, wherein the MCU is further configured to enter a power steering system safe mode limiting at least some functions of the motor driven power steering system, in response to the error rate of the digital signal exceeding a reference error rate.

3. The electronic device according to claim 2, wherein the ADC is configured to drive an internal sensor for the motor driven power steering system by using, as a reference signal, a second driving power signal outputted from the power management integrated circuit in order.

4. The electronic device according to claim 3, further comprising:
   wherein the ADC is further configured to convert the voltage-adjusted first driving power signal into the digital signal based on the reference signal, in response to receiving the voltage-adjusted first driving power signal, as at least a part of an operation for generating the digital signal.

5. The electronic device according to claim 4, wherein the reference error rate is determined as a value obtained by summing any one or any combination of any two or more of an error rate of an MCU power supply low dropout (LDO) that transmits the first driving power signal to the MCU, an error rate of the plurality of resistors, and an error rate of the ADC.

6. The electronic device according to claim 2, wherein the MCU is further configured to identify the error rate of the digital signal by comparing the digital signal with a previously stored digital signal, as at least a part of an operation for identifying the error rate of the digital signal.

7. The electronic device according to claim 2, wherein the power steering system safe mode includes any one or any combination of any two or more of a manual mode of a general motor driven power steering system, an output limit mode of a full redundancy motor driven power steering system, and a manual mode of the full redundancy motor driven power steering system.

8. A method to operate an electronic device, the operation method comprising:
generating, by a micro controller unit (MCU) of the electronic device, based on a first driving power signal output from a power management integrated circuit (PMIC) of the electronic device to drive the MCU, a digital signal for determining an error in a reference signal of an analog-to-digital converter (ADC) included in the MCU;
converting, by the ADC, a voltage-adjusted first driving power signal into the digital signal, based on the reference signal responsive to a reception of the first driving power signal having a voltage adjusted through a plurality of resistors;
identifying, by the MCU, an error rate of the digital signal; and
determining a mode for controlling a motor driven power steering system, based on the error rate of the digital signal.

9. The method according to claim 8, further comprising causing the MCU to enter a power steering system safe mode limiting at least some functions of the motor driven power steering system, in response to the error rate of the digital signal exceeding a reference error rate.

10. The method according to claim 9, further comprising driving, by the ADC, an internal sensor for the motor driven power steering system, using a second driving power signal output from the PMIC as a reference signal.

11. The method according to claim 10, wherein the reference error rate is determined as a value obtained by summing any one or any combination of any two or more of an error rate of an MCU power supply low dropout (LDO) that transmits the first driving power signal to the MCU, an error rate of the plurality of resistors, and an error rate of the ADC.

12. The method according to claim 9, wherein the identifying of the error rate of the digital signal comprises:
identifying, by the MCU, the error rate of the digital signal by comparing the digital signal with a previously stored digital signal.

13. The method according to claim 9, wherein the power steering system safe mode includes any one or any combination of any two or more of a manual mode of a general motor driven power steering system, an output limit mode of a full redundancy motor driven power steering system, and a manual mode of the full redundancy motor driven power steering system.

14. An electronic apparatus, the apparatus comprising:
a power management module configured to provide plural power supplies;
a plurality of resistors configured to adjust a first power supply of the plural power supplies to provide an adjusted voltage power signal;
an internal sensor power supply configured to receive a second power supply of the plural power supplies and to supply a reference signal; and
a micro controller unit (MCU) configured to receive the adjusted voltage power signal and the reference signal, wherein the MCU comprises:
an analog-to-digital converter (ADC) configured to receive external analog signals and to convert the received analog signals into a digital signal on a basis of the reference signal supplied from the internal sensor power supply; and
a core configured to receive the digital signal from the ADC, the core configured to:
identify an error in the reference signal; and
determine a mode for controlling a motor driven power steering system, based on the error.

15. The apparatus of claim 14, further comprising:
an external power supply sensor configured to receive a third power supply of the plural power supplies, the third power supply driving an external sensor providing an external sensor reading to the MCU as one of the external analog signals.

16. The apparatus of claim 14, wherein the internal sensor power supply drives an internal sensor with the second power supply to drive an internal sensor to provide an internal sensor reading to the MCU as one of the external analog signals.

17. The apparatus of claim 14, wherein the core is configured to control a steering system according to the digital signal.

18. The apparatus of claim 17, wherein the mode includes one of a normal mode of the steering system and one of a manual mode of the steering system, an output limit mode of a full redundancy motor driven power steering system, and a manual mode of the full redundancy motor driven power steering system based on the error.

19. The apparatus of claim 14, wherein the core determines the error by comparing the digital signal with previously stored digital signals.

* * * * *